(12) United States Patent
Inagaki et al.

(10) Patent No.: US 9,443,800 B2
(45) Date of Patent: Sep. 13, 2016

(54) PACKAGE SUBSTRATE AND METHOD FOR MANUFACTURING PACKAGE SUBSTRATE

(71) Applicant: IBIDEN CO., LTD., Ogaki-shi (JP)

(72) Inventors: Yasushi Inagaki, Ogaki (JP); Yasuhiro Takahashi, Ogaki (JP); Satoshi Kurokawa, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/669,393

(22) Filed: Mar. 26, 2015

(65) Prior Publication Data

US 2015/0279772 A1    Oct. 1, 2015

(30) Foreign Application Priority Data

Mar. 26, 2014 (JP) ................. 2014-064237

(51) Int. Cl.
| | |
|---|---|
| H01L 23/495 | (2006.01) |
| H01L 23/498 | (2006.01) |
| H01L 21/48 | (2006.01) |
| H01L 23/00 | (2006.01) |
| H01L 25/065 | (2006.01) |

(52) U.S. Cl.
CPC ....... *H01L 23/49827* (2013.01); *H01L 21/486* (2013.01); *H01L 21/4857* (2013.01); *H01L 23/49822* (2013.01); *H01L 23/49838* (2013.01); *H01L 24/00* (2013.01); *H01L 25/065* (2013.01); *H01L 23/49811* (2013.01)

(58) Field of Classification Search
CPC ............... H01L 23/49822; H01L 23/49827; H01L 23/49811; H01L 23/49838; H01L 21/486; H01L 21/4857; H01L 24/00; H01L 25/065

USPC .......... 257/668, 700, 774; 438/123
See application file for complete search history.

(56) References Cited

U.S. PATENT DOCUMENTS 7,279,771 B2 * 10/2007 Sunohara .......... H01L 23/49822
174/255

FOREIGN PATENT DOCUMENTS

JP          06-053349          2/1994

* cited by examiner

*Primary Examiner* — Thien F Tran
(74) *Attorney, Agent, or Firm* — Oblon, McClelland, Maier & Neustadt, L.L.P

(57) ABSTRACT

A package substrate includes interlayer insulating layers including outermost and inner-layer layers, conductor layers including an outermost layer, a first layer between the outermost and inner-layer layers, and a second layer on which the inner-layer layer is formed, via conductors including first and second conductors through the outermost insulating layer, and skip via conductors through the outermost and inner-layer insulating layers to connect the outermost and second conductor layers. The outermost conductor layer includes first and second pads to mount first and second electronic components on the outermost insulating layer, the first conductors are positioned to connect the first conductor layer and first pads, the second conductors are positioned to connect the first conductor layer and second pads, and the first conductor layer has area on surface of the inner-layer insulating layer which is in range of 3 to 15% of area of the surface of the inner-layer insulating layer.

20 Claims, 13 Drawing Sheets

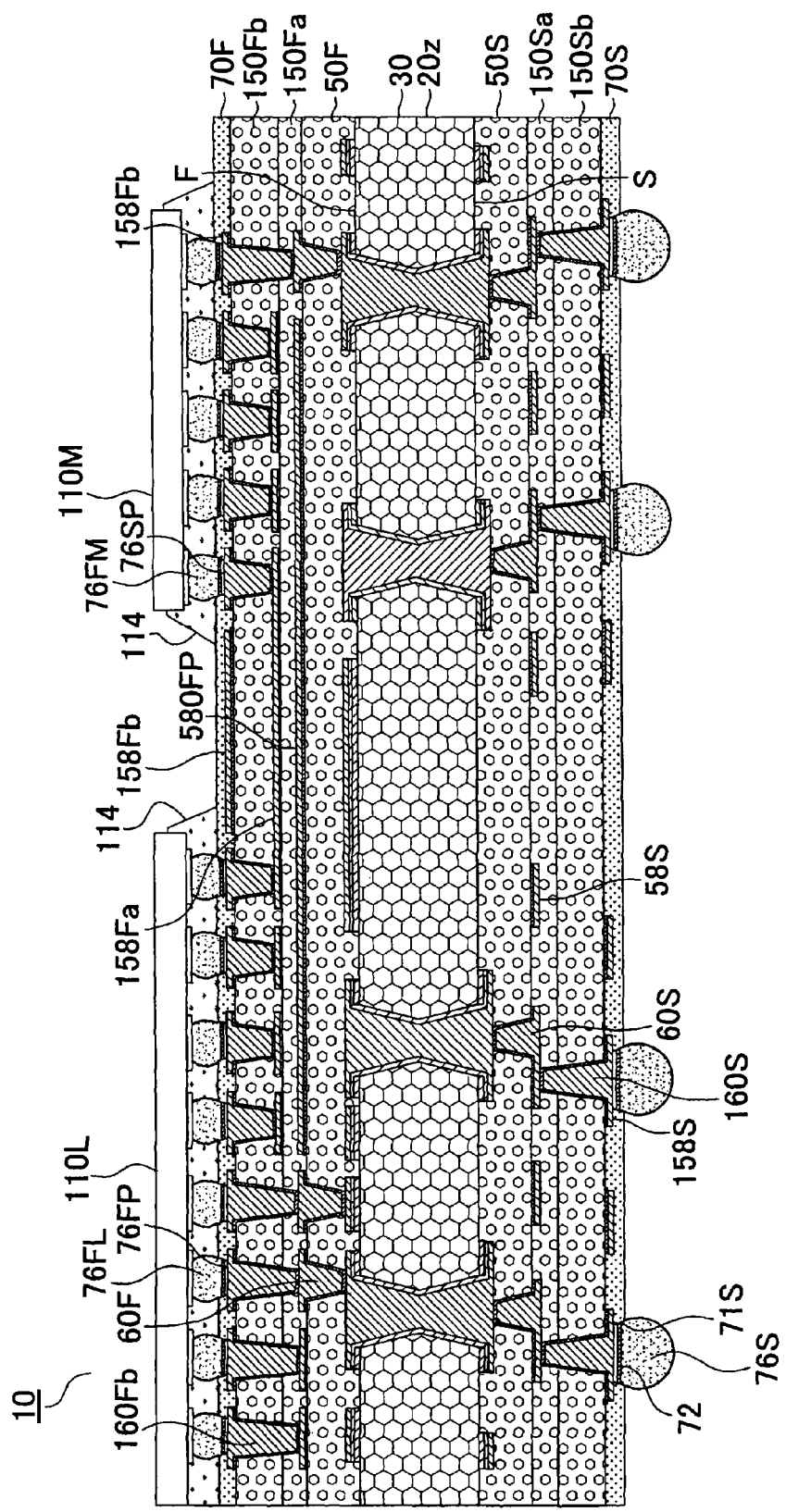

PACKAGE SUBSTRATE AND METHOD FOR MANUFACTURING PACKAGE SUBSTRATE

CROSS-REFERENCE TO RELATED APPLICATIONS

The present application is based upon and claims the benefit of priority to Japanese Patent Application No. 2014-064237, filed Mar. 26, 2014, the entire contents of which are incorporated herein by reference.

BACKGROUND OF THE INVENTION

1. Field of the Invention

The present invention relates to a package substrate on which multiple electronic components are mounted and to a method for manufacturing the package substrate.

2. Description of Background Art

Japanese Patent Laid-Open Publication No. HEI 6-53349 describes a multichip module substrate. According to Japanese Patent Laid-Open Publication No. HEI 6-53349, two LSIs are mounted on one substrate. The two LSIs are connected by multiple wiring layers. In Japanese Patent Laid-Open Publication No. HEI 6-53349, the wiring layers are depicted in different insulating layers. The entire contents of this publication are incorporated herein by reference.

SUMMARY OF THE INVENTION

According to one aspect of the present invention, a package substrate includes multiple interlayer resin insulating layers including an outermost interlayer resin insulating layer and an inner-layer interlayer resin insulating layer, multiple conductor layers including an outermost conductor layer formed on the outermost interlayer resin insulating layer, a first conductor layer formed between the outermost interlayer resin insulating layer and the inner-layer interlayer resin insulating layer, and a second conductor layer on which the inner-layer interlayer resin insulating layer is formed, multiple via conductors including multiple first via conductors formed through the outermost interlayer resin insulating layer and multiple second via conductors formed through the outermost interlayer resin insulating layer, and multiple skip via conductors formed through the outermost interlayer resin insulating layer and the inner-layer interlayer resin insulating layer such that the skip via conductors are connecting the outermost conductor layer and the second conductor layer. The outermost conductor layer includes first pads positioned to mount a first electronic component on the outermost interlayer resin insulating layer and second pads positioned to mount a second electronic component on the outermost interlayer resin insulating layer, the first via conductors are positioned such that the first via conductors are connecting the first conductor layer and the first pads, the second via conductors are positioned such that the second via conductors are connecting the first conductor layer and the second pads, and the first conductor layer is formed such that the first conductor layer has an area on a surface of the inner-layer interlayer resin insulating layer which is in a range of 3% to 15% of an area of the surface of the inner-layer interlayer resin insulating layer.

According to another aspect of the present invention, a method for manufacturing a package substrate includes forming an inner-layer interlayer resin insulating layer, forming a first wiring layer on a surface of the inner-layer interlayer resin insulating layer such that the first wiring layer is formed to transmit data between a first electronic component and a second electronic component, forming an outermost interlayer resin insulating layer on the inner-layer interlayer resin insulating layer such that the outermost interlayer resin insulating layer covers the first wiring layer, forming an outermost conductor layer including first pads and second pads such that the first pads are positioned to mount the first electronic component on the outermost interlayer resin insulating layer and that the second pads are positioned to mount the second electronic component on the outermost interlayer resin insulating layer, forming multiple first via conductors through the outermost interlayer resin insulating layer such that the first via conductors connect the first pads and the first wiring layer, forming multiple second via conductors through the outermost interlayer resin insulating layer such that the second via conductors connect the second pads and the first wiring layer, and forming multiple skip via conductors through the outermost interlayer resin insulating layer and the inner-layer interlayer resin insulating layer such that the skip via conductors connect the outermost conductor layer and a second conductor layer on which the inner-layer interlayer resin insulating layer is formed. The first wiring layer is formed such that the first conductor layer has an area on the surface of the inner-layer interlayer resin insulating layer which is in a range of 3% to 15% of an area of the surface of the inner-layer interlayer resin insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 illustrates a cross-sectional view of an application example of the package substrate according to the first embodiment;

DETAILED DESCRIPTION OF THE EMBODIMENTS

Figure 1:
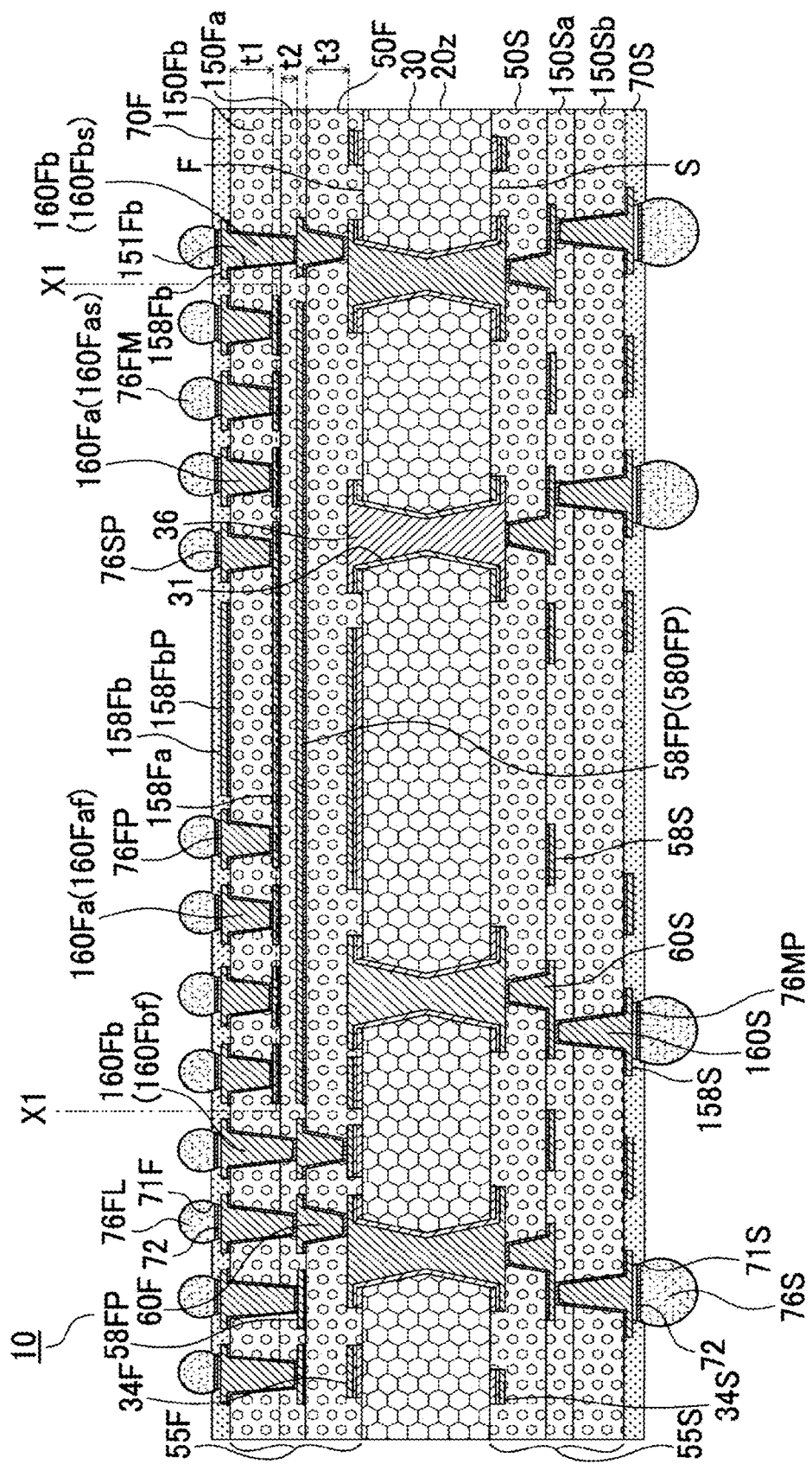
FIG. 1 illustrates a cross-sectional view of a package substrate according to a first embodiment of the present invention.

The embodiments will now be described with reference to the accompanying drawings, wherein like reference numerals designate corresponding or identical elements throughout the various drawings.

First Embodiment

Figure 10A:
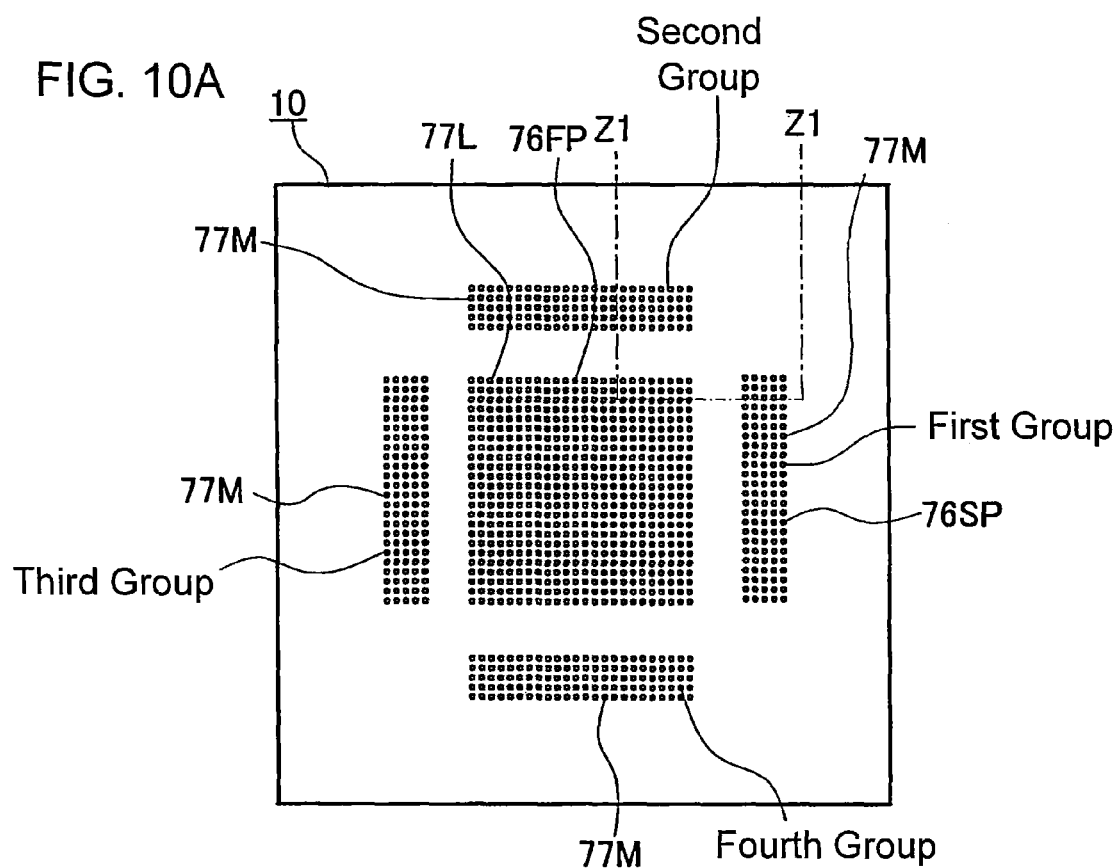
FIG. 10A illustrates a plan view illustrating pad groups.
Figure 10B:
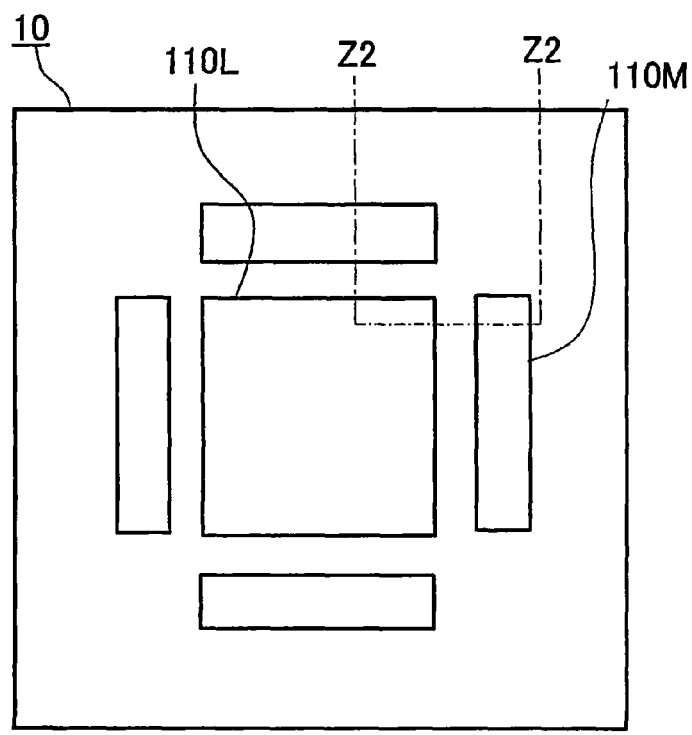
FIG. 10B illustrates a plan view of the application example.

FIG. 10A illustrates a mounting surface of a package substrate according to a first embodiment of the present invention. FIG. 10B illustrates a plan view of an application example of the present embodiment, in which electronic components are mounted on the package substrate of the present embodiment. As illustrated in FIG. 10A, a mounting area (77L) for mounting a first electronic component such as a logic IC is formed at a central part of the mounting surface of the package substrate. First pads (76FP) for mounting the first electronic component are formed in a lattice-like shape in the mounting area (77L). The first pads (76FP) form a first pad group. Solder bumps for mounting the first electronic component are formed on the first pads. A mounting area (77M) for mounting a second electronic component such as a memory is formed outside of the mounting area (77L). In FIG. 10A, four mounting areas (77M) are formed around the mounting area (77L). Second pads (76SP) for mounting a second electronic component are formed in a lattice-like shape in each of the mounting areas (77M). The second pads form a second pad group. Solder bumps for mounting the second electronic component are formed on the second pads. In FIG. 10B, a logic IC (110L) is mounted on the solder bumps of the mounting area (77L), and a memory (110M) is mounted on the solder bumps of the mounting area (77M).

A cross section of the package substrate of the present embodiment along a line segment (Z1-Z1) illustrated in FIG. 10A is illustrated in FIG. 1. A cross section of the package substrate of the present embodiment along a line segment (Z2-Z2) illustrated in FIG. 10B is illustrated in FIG. 2. The solder bumps (76FL) for mounting the first electronic component (110L) are formed on the first pads (76FP). The solder bumps (76FM) for mounting the second electronic component (110M) are formed on the second pads (76SP).

As illustrated in FIG. 1, the package substrate of the present embodiment has an outermost conductor layer (158Fb) that contains pads for mounting an electronic component. Further, the package substrate has an outermost interlayer resin insulating layer (150Fb) that supports the outermost conductor layer (158Fb).

In the present embodiment, first via conductors (160Faf) that connect to the first pads (76FP) and second via conductors (160Fas) that connect to the second pads (76SP) are formed in the outermost interlayer resin insulating layer (150Fb). It is preferable that the first via conductors be formed directly below the first pads. It is preferable that the second via conductors be formed directly below the second pads. A first conductor layer (158Fa) containing first conductor circuits is formed below the outermost interlayer resin insulating layer (150Fb). The first pads and the second pads are connected by the first conductor circuits. That is, exchange of a signal or the like between the first electronic component and the second electronic component is performed via the first conductor layer. All of the first conductor circuits connect the first pads and the second pads. All conductor circuits that are formed on a same plane as the first conductor circuits are included in the first conductor layer. The first conductor layer is a dedicated wiring layer for exchange of signals between the first electronic component and the second electronic component. The first conductor layer has no other conductor circuits than the conductor circuits (signal lines) for performing exchange of signals between the first electronic component and the second electronic component. The first conductor layer functions as a dedicated wiring layer for data transmission between the first electronic component and the second electronic component.

In general, data of one bit is transmitted by one signal line (one first conductor circuit). A command or data that is processed by an electronic device such as a personal computer is structured in one byte (8 bits). When the signal lines have different widths or thicknesses, the signal lines have different electrical characteristics such as transmission speeds. Therefore, differences may occur in transmission times of signals of a byte unit. It is expected that the signals are not properly processed or processing time becomes long. It is expected that differences occur in transmission times between bits in one byte. Further, due to variations in the widths and the thicknesses of the signal lines, there may exist signal lines that have slow transmission speeds. It is expected that, due to these signal lines, processing is slowed.

The present embodiment has the dedicated wiring layer. Therefore, when the conductor layer (dedicated wiring layer) that contains the signal lines is formed, manufacturing conditions and the like are set to match the widths and thicknesses of the signal lines. Therefore, according to the present embodiment, variations in the widths and the thicknesses of signal lines are reduced. The signal lines have substantially the same transmission speeds. The signals are properly processed. The processing is not slowed even when an amount of information is large. Depending on functions of the electronic components, multiple dedicated wiring layers can be formed in the package substrate of the present embodiment. However, when multiple dedicated wiring layers are formed, it is expected that differences in the thicknesses and in the widths of the signal lines become large. Therefore, in order to reduce the variation of transmission times between the electronic components, it is preferable that there be one dedicated wiring layer. However, even when the dedicated wiring layer is formed in different layers, each layer has only wirings for data transmission. Therefore, differences in transmission times are small. One conductor layer contains all conductor circuits sandwiched by two interlayer resin insulating layers. However, for example, a circuit such as a dummy conductor that does not transmit a signal or power is not included in the conductor circuits.

An inner-layer interlayer resin insulating layer (150Fa) is formed below the outermost interlayer resin insulating layer and the first conductor layer (dedicated wiring layer). The outermost interlayer resin insulating layer and the first conductor layer (dedicated wiring layer) are supported by the inner-layer interlayer resin insulating layer. In FIG. 1, all conductor circuits sandwiched by the inner-layer interlayer resin insulating layer and the outermost interlayer resin insulating layer are the first conductor circuits. It is preferable that the outermost interlayer resin insulating layer be formed directly above the dedicated wiring layer and the inner-layer interlayer resin insulating layer. A distance is reduced between the electronic component and the dedicated wiring layer.

A second conductor layer (58FP) that contains second conductor circuits is formed below the inner-layer interlayer resin insulating layer (150Fa). Supply of power to the electronic components, and the like, are performed via the second conductor layer. Therefore, the first pads and the second pads include pads that are connected to the second conductor layer. Connection between the second conductor layer and the pads connected to the second conductor layer is done via skip via conductors (160Fb). The skip via conductors (160Fb) are via conductors that are formed in openings (151Fb) for the via conductors and penetrate through both the outermost interlayer resin insulating layer (150Fb) and the inner-layer interlayer resin insulating layer (150Fa) to reach the second conductor layer (58FP). The skip via conductors (160Fb) penetrate through both the outermost interlayer resin insulating layer and the inner-layer interlayer resin insulating layer.

Since the first conductor layer (158Fa) is the dedicated wiring layer, there are no other via conductors than the skip via conductors that penetrate through the inner-layer interlayer resin insulating layer. The package substrate of the present embodiment does not have via conductors that penetrate through only the inner-layer interlayer resin insulating layer. Therefore, an area for forming the first conductor circuits in the first conductor layer is increased. A large number of the first conductor circuits are formed in the first conductor layer. Sophisticated electronic components can be mounted on the package substrate of the present embodiment. The dedicated wiring layer is formed in a single layer. Data transmission speed is increased.

The conductor circuits (first conductor layer) of the dedicated wiring layer have a thickness smaller than that of the outermost conductor layer and that of the second conductor layer. The thickness of the outermost conductor layer and the thickness of the second conductor layer are substantially the same. For example, the thickness of the first conductor layer is ½ of the thickness of the outermost conductor layer or less and is 3 μm or more. For example, the thickness of the first conductor layer is about 5 μm, and the thickness of the outermost conductor layer and the thickness of the second conductor layer are about 10 μm. As a result, fine conductor circuits can be formed in the dedicated wiring layer. Sophisticated electronic components can be mounted on the package substrate.

The first conductor circuits have a width smaller than that of the conductor circuits contained in the outermost conductor layer and the second conductor layer. Here, the width of the conductor circuits is a width of a narrowest conductor circuit in each conductor layer. The width of the first conductor circuits is in a range from ½ to ⅔ of the width of the conductor circuits contained in the outermost conductor layer and the second conductor layer. For example, the width of the first conductor circuits is about 5 μm, and the width of the conductor circuits contained in the outermost conductor layer and the second conductor layer is about 9 μm. The conductor circuits are each cut in a plane perpendicular to a propagation direction of the conductor circuit. A smallest distance among distances between opposing walls is the width of the conductor circuits.

A distance (width) of a space between adjacent first conductor circuits is smaller than a distance of a space between adjacent second conductor circuits. The distance of the space between adjacent first conductor circuits is in a range from ½ to ⅔ of the distance of the space between adjacent second conductor circuits. For example, the distance of the space between adjacent first conductor circuits is about 5 μm, and the distance of the space between adjacent second conductor circuits is about 12 μm. Here, the distance of the space is a distance of a narrowest space in each conductor layer. The distance of the space and a distance between adjacent conductor circuits are the same. It is desirable that a signal line be a strip line or a microstrip line. When a signal line is a strip line, the signal line is sandwiched by the outermost conductor layer and the second conductor layer.

The package substrate of the present embodiment has the dedicated wiring layer, the outermost interlayer resin insulating layer that is formed on the dedicated wiring layer, the outermost conductor layer that is formed on the outermost interlayer resin insulating layer and contains the pads for mounting the electronic components, and the via conductors that penetrate through the outermost interlayer resin insulating layer and connect the pads and the dedicated wiring layer. The pads include the first pads for mounting the first electronic component and the second pads for mounting the second electronic component. Further, the first pads include first pads that connect to the dedicated wiring layer and first pads that connect to a conductor layer other than the dedicated wiring layer. Further, the second pads include second pads that connect to the dedicated wiring layer and second pads that are not connected the dedicated wiring layer. The pads that are not connected to the dedicated wiring layer are connected to the skip via conductors. A circuit is closed by a first pad that connects to the dedicated wiring layer, a signal line in the dedicated wiring layer and a second pad that connects to the dedicated wiring layer. The package substrate of the present embodiment can further have the second conductor layer, the inner-layer interlayer resin insulating layer on the second conductor layer, and the skip via conductors that penetrate through the outermost interlayer resin insulating layer and the inner-layer interlayer resin insulating layer. The dedicated wiring layer is formed on the inner-layer interlayer resin insulating layer. The dedicated wiring layer is sandwiched by the outermost interlayer resin insulating layer and the inner-layer interlayer resin insulating layer.

The package substrate of the present embodiment may also have a core substrate that has a conductor layer. In this case, the inner-layer interlayer resin insulating layer is formed on the core substrate, and the conductor layer of the core substrate corresponds to the second conductor layer. Further, the package substrate of the present embodiment may also have a build-up layer between the core substrate and the inner-layer interlayer resin insulating layer. A conductor layer (58FP) sandwiched by an interlayer resin insulating layer (50F) on the core substrate and the inner-layer interlayer resin insulating layer (150Fa) is the second conductor layer. The build-up layer includes interlayer resin insulating layers and conductor layers, and the interlayer resin insulating layers and the conductor layers are alternately laminated. A package substrate having a core substrate and a manufacturing method thereof are described, for example, in JP2007 227512A. The entire contents of this publication are incorporated herein by reference. The package substrate of the present embodiment may be a coreless substrate. The coreless substrate includes interlayer resin insulating layers and conductor layers, and the interlayer resin insulating layers and the conductor layers are alternately laminated. A coreless substrate and a manufacturing method thereof are described, for example, in JP2005 236244A. At least one conductor layer among the conductor layers is the dedicated wiring layer. Each of the interlayer resin insulating layers of the coreless substrate has a thickness in a range from 30 μm to 60 μm.

A package substrate 10 illustrated in FIG. 1 has a core substrate 30 similar to that in JP2007 227512A. The core substrate 30 has an insulating substrate (20z) that has a first surface (F) and a second surface (S) that is on an opposite side of the first surface. A conductor layer (34F) is formed on the first surface (F) of the insulating substrate (20z), and a conductor layer (34S) is formed on the second surface (S) of the insulating substrate (20z). The insulating substrate (20z) has multiple through holes 31, and through-hole conductors 36 that connect the conductor layer (34F) and the conductor layer (34S) are formed inside the through holes 31. The through holes 31 for the through-hole conductors each have a hourglass shape similar to that in JP2007 227512A.

A first build-up layer (55F) is formed on the first surface (F) of the core substrate 30. A first surface of the core substrate and the first surface of the insulating substrate are the same surface. The first build-up layer (55F) includes the interlayer resin insulating layer (upper side interlayer resin insulating layer) (50F) that is formed on the core substrate 30, the second conductor layer (58FP) on the interlayer resin insulating layer (50F), and via conductors (60F) that penetrate through the interlayer resin insulating layer (50F) and connect the second conductor layer (58FP) and the conductor layer (34F).

The first build-up layer further includes the inner-layer interlayer resin insulating layer (150Fa) that is formed on the interlayer resin insulating layer (50F) and the second conductor layer (58FP), and the first conductor layer (158Fa) that is formed on the inner-layer interlayer resin insulating layer (150Fa). The first conductor layer is the dedicated wiring layer. There is no via conductor that penetrates through only the inner-layer interlayer resin insulating layer (150Fa). The first build-up layer further includes the uppermost interlayer resin insulating layer (outermost interlayer resin insulating layer) (150Fb) that is formed on the inner-layer interlayer resin insulating layer (150Fa) and the first conductor layer (158Fa), the uppermost conductor layer (outermost conductor layer) (158Fb) that is formed on the uppermost interlayer resin insulating layer (150Fb), via conductors (uppermost via conductors) (160Fa) that penetrate through the uppermost interlayer resin insulating layer and connect the uppermost conductor layer and the first conductor layer, and the skip via conductors (160Fb) that penetrate through the uppermost interlayer resin insulating layer and the inner-layer interlayer resin insulating layer and connect the uppermost conductor layer and the second conductor layer. The uppermost conductor layer includes the first pads (76FP) for mounting the first electronic component, and the second pads (76SP) for mounting the second electronic component. The uppermost via conductors include the first via conductors (uppermost first via conductors) (160Faf) that connect the first pads and the first conductor layer, and the second via conductors (uppermost second via conductors) (160Fas) that connect the second pads and the first conductor layer. The skip via conductors include first skip via conductors (160Fbf) that connect the first pads and the second conductor layer, and second skip via conductors (160Fbs) that connect the second pads and the second conductor layer. When multiple dedicated wiring layers are formed, it is preferable that the dedicated wiring layers be formed only in the first build-up layer.

A second build-up layer (55S) is formed on the second surface (S) of the core substrate 30. The second build-up layer (55S) includes interlayer resin insulating layers and conductor layers, and the interlayer resin insulating layers and the conductor layers are alternately laminated. It is preferable that the first build-up layer and the second build-up layer be symmetrically formed across the core substrate.

A solder resist layer (70F) having openings (71F) is formed on the first build-up layer (55F), and a solder resist layer (70S) having openings (71S) is formed on the second build-up layer (55S). The first pads (76FP) and the second pads (76SP) are exposed from the openings (71F) of the solder resist layer (70F) on the first build-up layer (55F). The (first solder bumps) solder bumps (76FL) are formed on the first pads, and the solder bumps (second solder bumps) (76FM) are formed on the second pads. It is preferable that a melting point of the first solder bumps and a melting point of the second solder bumps be different. Mounting yield and connection reliability are improved. Further, replacement of the electronic components can be easily performed. Solder bumps (third solder bumps) (76S) for connecting to a motherboard are formed on pads (76MP) that are exposed from the openings (71S) of the solder resist layer (70S) on the second build-up layer (55S). A metal film 72 such as Ni/Au or Ni/Pd/Au is formed on each of the pads (76FP, 76SP, 76MP). As illustrated in FIGS. 2 and 10B, the IC chip (110L) is mounted on the solder bumps (76FL) for mounting the IC chip, and the memory (110M) is mounted on the solder bumps (76FM) for mounting the memory. The package substrate 10 is mounted on a motherboard via the solder bumps (76S) that are formed on the second build-up layer. It is preferable that the melting point of the first solder bumps, the melting point of the second solder bumps and a melting point of the third solder bumps be different from each other. Mounting yield and connection reliability are high.

Figure 11A:
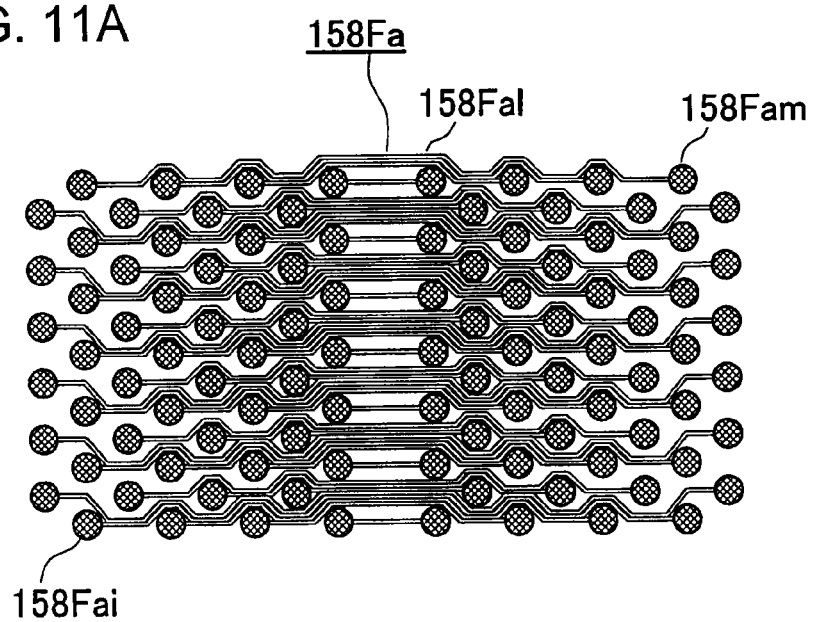
FIGS. 11A and 11B illustrate plan views of a first conductor layer.
Figure 11B:
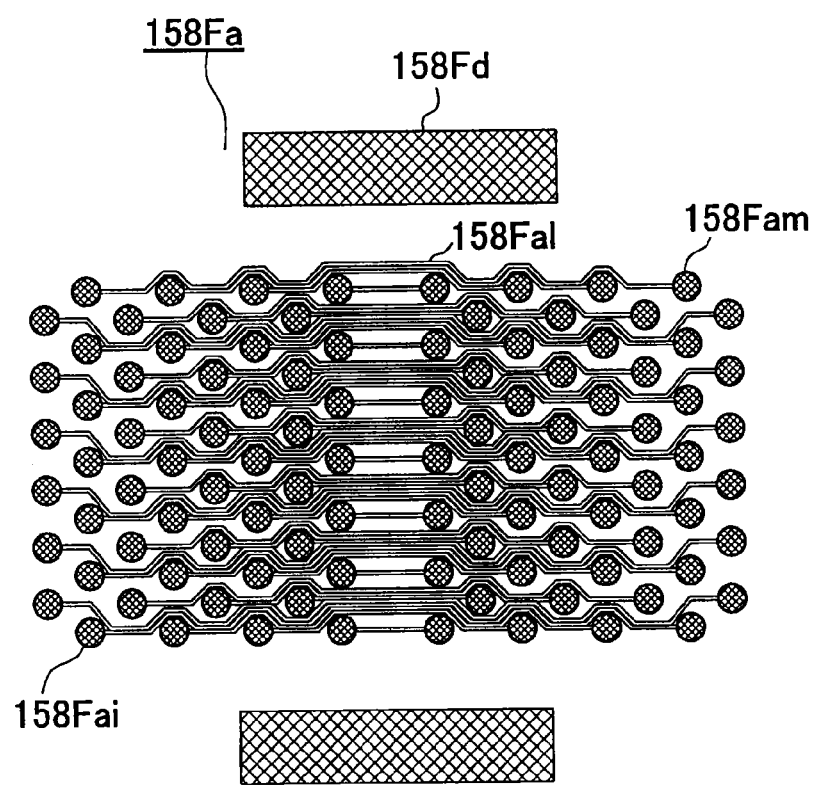

FIGS. 11A and 11B are plan views illustrating a portion of the dedicated wiring layer (first conductor layer) (158Fa). Conductors that are each depicted in a round shape in the figures are pads. Pads that are depicted on a left side are first via conductor pads (158Fai), and pads that are depicted on a right side are second via conductor pads (158Fam). The first via conductors (160Faf) are formed on the first via conductor pads, and the second via conductors (160Fas) are formed on the second via conductor pads. Each first conductor circuit includes a first via conductor pad (158Fai), a second via conductor pad (158Fam), and a connection wiring (158Fal) that connects the first via conductor pad (158Fai) and the second via conductor pad (158Fam). In the package substrate of the first embodiment, all data transmission between the first electronic component such as a logic chip and the second electronic component such as a memory chip is performed via the first conductor layer.

In the package substrate of the first embodiment, in order to increase a wiring density, the first conductor layer (158Fa) is formed at a finer pitch than conductor layers on other layers. Therefore, the wiring width is narrow (for example, about 3-11 μm, and an optimal value is 5 μm), the thickness is also small (for example, about 3-11 μm, and an optimal value is 5 μm). An area where the first conductor layer is in contact with the inner-layer interlayer resin insulating layer is 3%-15% of an area of an upper surface of the inner-layer interlayer resin insulating layer (area of the package substrate). Here, when the area is less than 3%, variation in plating thickness is increased. Therefore, a wiring is likely to break at a place where the wiring becomes too thin and thus desired connection reliability cannot be obtained. On the other hand, when the area exceeds 15%, volumes of conductor circuits on front and back sides of the package substrate are different and unbalanced. That is, the volume of copper laminated on the supper side is larger than the volume of copper laminated on the lower side and, due to a thermal stress, upper side rigidity becomes too higher than lower side rigidity and warpage is likely to occur. Therefore, by making the area to be 3%-15%, an effect due to warpage is reduced and high connection reliability is obtained. FIG. 11A illustrates a case where the area of only the dedicated wiring layer (first conductor layer) (158Fa) exceeds 3% of that of the inner-layer interlayer resin insulating layer. FIG. 11B illustrates a case where the area of only the dedicated wiring layer (first conductor layer) (158Fa) is less than 3% of that of the inner-layer interlayer resin insulating layer. In this case, in order to make the copper area to be 3% or more, dummy patterns (158Fd) are provided.

In the first conductor circuits (158Fa), strip lines are formed that are sandwiched by a plane layer (158FbP) contained in the uppermost conductor layer and a plane layer (580FP) contained in the second conductor layer. Transmission characteristics of the first conductor circuit are improved.

The inner-layer interlayer resin insulating layer has a thickness different from that of other interlayer resin insulating layers. Among the interlayer resin insulating layers, interlayer resin insulating layers other than the inner-layer interlayer resin insulating layer have the same thickness. The thickness of an interlayer resin insulating layer is equal to a distance between adjacent conductor layers. In FIG. 1, a thickness (t1) of the outermost interlayer resin insulating layer (150Fb) and a thickness (t3) of the upper side interlayer resin insulating layer (50F) are equal. The thickness (t1, t3) of the interlayer resin insulating layers other than the inner-layer interlayer resin insulating layer is in a range from 15 μm to 40 μm. The thickness (t2) of the inner-layer interlayer resin insulating layer is in a range from 7.5 μm to 20 μm. The thickness (t2) of the inner-layer interlayer resin insulating layer is in a range from ½ to ⅓ of the thickness (t1, t3) of the other interlayer resin insulating layers. Fine skip via conductors can be formed. Due to the skip via conductors, a formation area of the first conductor layer is unlikely to be decreased. The package substrate becomes smaller. For example, the thickness (t2) of the inner-layer interlayer resin insulating layer (150Fa) is 13 μm, and the thickness of the interlayer resin insulating layers other than the inner-layer interlayer resin insulating layer is 35 μm.

In the package substrate of the first embodiment, the dedicated wiring layer is formed directly below the outermost interlayer resin insulating layer (150Fb). Therefore, wiring distances between the electronic components are reduced. The signal transmission speed between the electronic components can be increased. The package substrate of the present embodiment has the dedicated wiring layer. Therefore, the signal lines have similar electrical characteristics. Transmission times of signals of a byte unit become uniform. Even when the transmission speed is fast, a signal can be properly transmitted. The processing is not slowed even when an amount of information is increased. The package substrate of the present embodiment does not have via conductors that penetrate through only the inner-layer interlayer resin insulating layer. The package substrate of the present embodiment has the skip via conductors that penetrate through the inner-layer interlayer resin insulating layer and the interlayer resin insulating layer on the inner-layer interlayer resin insulating layer. The package substrate is reduced in size. Transmission times of signals of a byte unit become uniform. Even when the transmission speed is fast, a signal can be properly transmitted. The processing is not slowed even when an amount of information is increased.

Method for Manufacturing Package Substrate of First Embodiment

A method for manufacturing the package substrate 10 of the first embodiment is illustrated in FIG. 3A-9C.

Figure 3A:
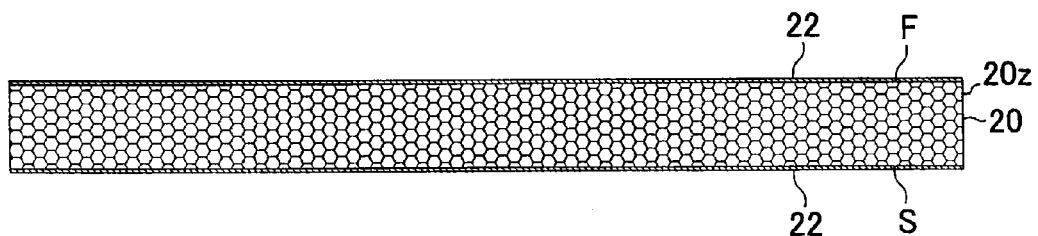
FIG. 3A-3C illustrate process diagrams illustrating a method for manufacturing the package substrate of the first embodiment.

(1) A starting substrate 20 having a first surface (F) and a second surface (S) that is on an opposite side of the first surface is prepared. It is preferable that the starting substrate be a double-sided copper-clad laminated plate. The double-sided copper-clad laminated plate is formed from an insulating substrate (20z) having a first surface (F) and a second surface (S) that is on an opposite side of the first surface and metal foils 22, 22 that are laminated on both sides of the insulating substrate (20z) (FIG. 3A). The starting substrate of the first embodiment is the double-sided copper-clad laminated plate. A surface of the copper foil 22 is subjected to blackening treatment.

The insulating substrate (20z) is formed of a resin and a reinforcing material. Examples of the reinforcing material include a glass cloth, aramid fibers, glass fibers, and the like. Examples of the resin include an epoxy resin, a BT (bismaleimide triazine) resin, and the like.

Figure 3B:
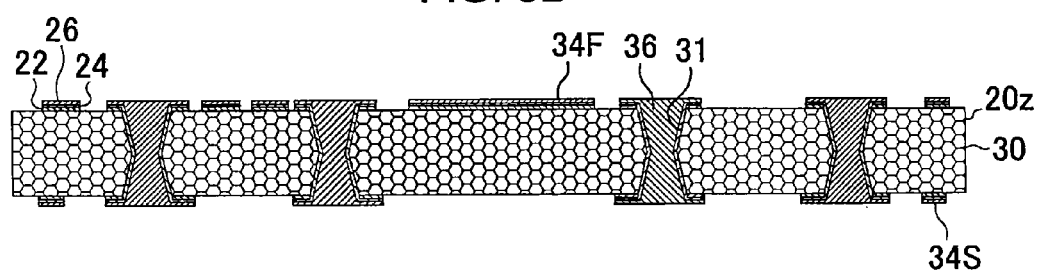

(2) The double-sided copper-clad laminated plate is processed, and the core substrate 30 is completed that includes the upper side conductor layer (34F), the lower side conductor layer (34S) and the through-hole conductors 36, the upper side conductor layer (34F) and the lower side conductor layer (34S) being each formed from the metal foil 22, an electroless plating film 24 and an electrolytic plating film 26, and the through-hole conductors 36 being formed in the through holes 31 (FIG. 3B). The first surface of the core substrate 30 and the first surface of the insulating substrate (20z) are the same surface; and the second surface of the core substrate 30 and the second surface of the insulating substrate (20z) are the same surface. The core substrate 30 is manufactured, for example, using a method described in U.S. Pat. No. 7,786,390. The entire contents of this patent are incorporated herein by reference.

Figure 3C:
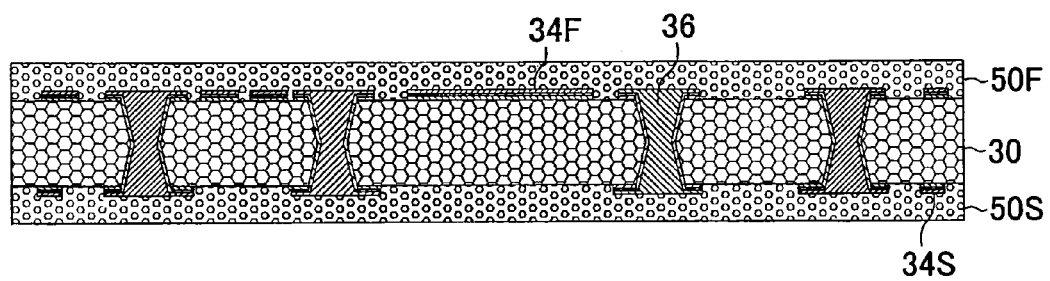

(3) The upper side interlayer resin insulating layer (50F) is formed on the first surface (F) of the core substrate 30. A lower side interlayer resin insulating layer (50S) is formed on the second surface (S) of the core substrate (FIG. 3C). The resin insulating layers contain inorganic particles such as silica and a thermosetting resin such as epoxy. The interlayer resin insulating layers may further contain a reinforcing material such as a glass cloth. The interlayer resin insulating layers (50F, 50S) each have a thickness of about 35 μm.

Figure 4A:
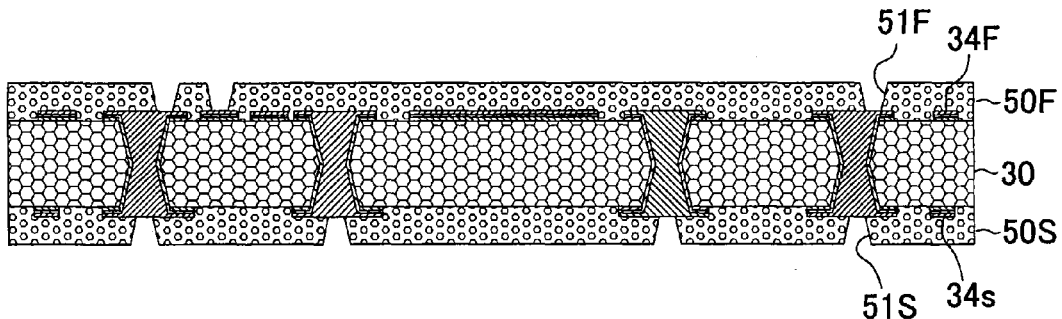
FIG. 4A-4D illustrate process diagrams illustrating the method for manufacturing the package substrate of the first embodiment.

(4) Next, openings (51F, 51S) for via conductors are respectively formed in the interlayer resin insulating layers (50F, 50S) using CO2 gas laser (FIG. 4A).

Figure 4B:
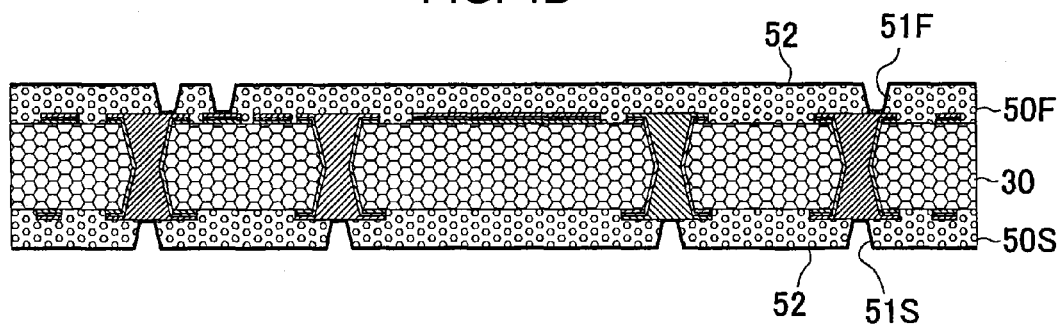

(5) Electroless copper plating films (52, 52) are formed on the interlayer resin insulating layers (50F, 50S) and on inner walls of the openings (51F, 51S) (FIG. 4B).

Figure 4C:
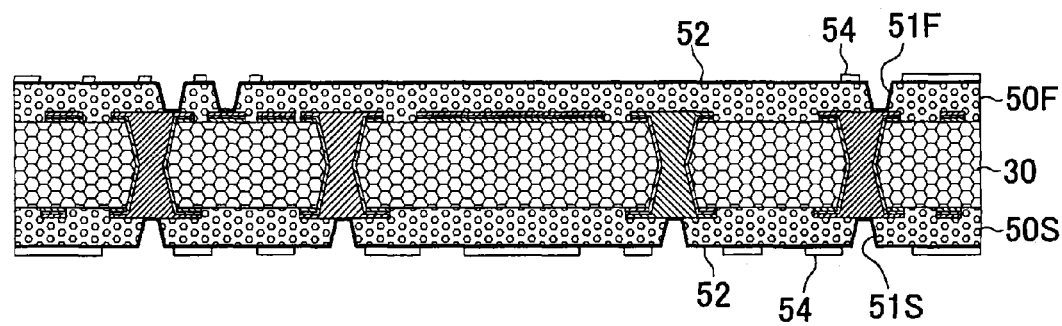

(6) A plating resist 54 is formed on the electroless copper plating film 52 (FIG. 4C).

Figure 4D:
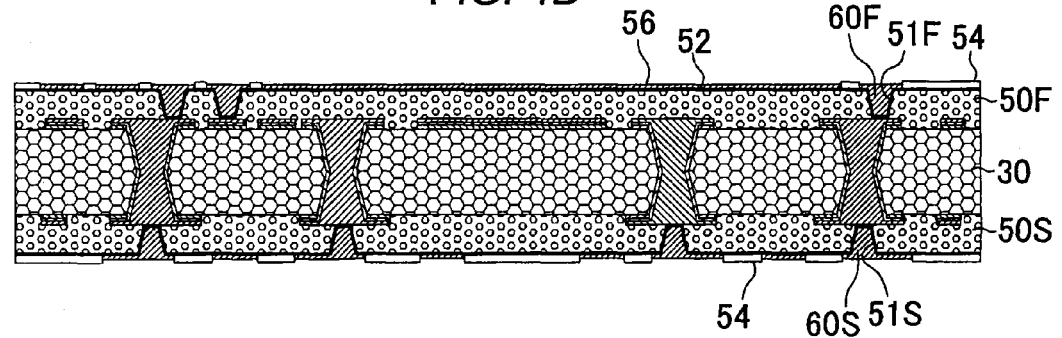

(7) An electrolytic copper plating film 56 is formed on the electroless copper plating film 52 that is exposed from the plating resist 54. In this case, the openings (51F, 51S) are filled by the electrolytic plating film 56. Via conductors (60F, 60S) are formed (FIG. 4D).

Figure 5A:
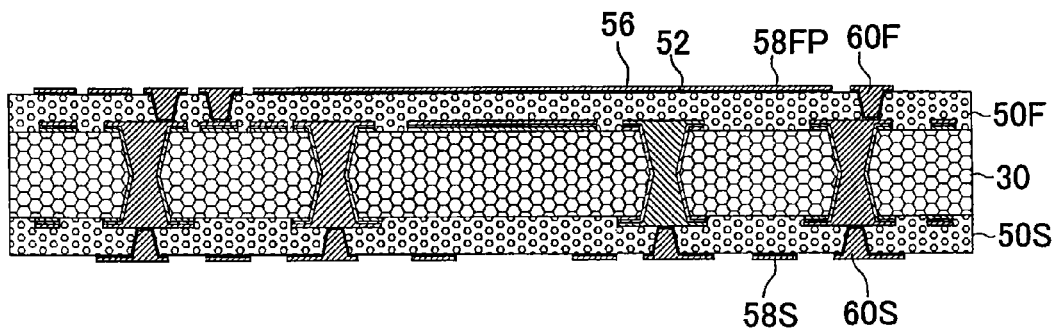
FIG. 5A-5C illustrate process diagrams illustrating the method for manufacturing the package substrate of the first embodiment.

(8) The plating resist 54 is removed. The electroless plating film 52 that is exposed from the electrolytic plating film 56 is removed. The second conductor layer (upper side second conductor layer) (58FP) is formed on the interlayer resin insulating layer (50F). The second conductor layer (lower side second conductor layer) (58S) is formed on the interlayer resin insulating layer (50S) (FIG. 5A).

(9) A resin film of a B-stage is prepared that has a first surface and a second surface that is on an opposite of the first surface. A seed layer 151 is formed on the first surface of the resin film by sputtering. The seed layer is formed of copper or the like. The seed layer (sputtering film) has a thickness in a range from 0.05 μm to 0.3 μm. The resin film with the seed layer is laminated on the upper side second conductor layer (58FP) and on the upper side interlayer resin insulating layer (50F) in a manner that the second surface of the resin film opposes the upper side interlayer resin insulating layer (50F). Thereafter, the resin film is cured and thereby, the inner-layer interlayer resin insulating layer (upper side inner-layer interlayer resin insulating layer) (150Fa) is formed on the upper side second conductor layer (58FP) and on the upper side interlayer resin insulating layer (50F). In the present embodiment, the upper side inner-layer interlayer resin insulating layer is an interlayer resin insulating layer with a seed layer.

Figure 5B:
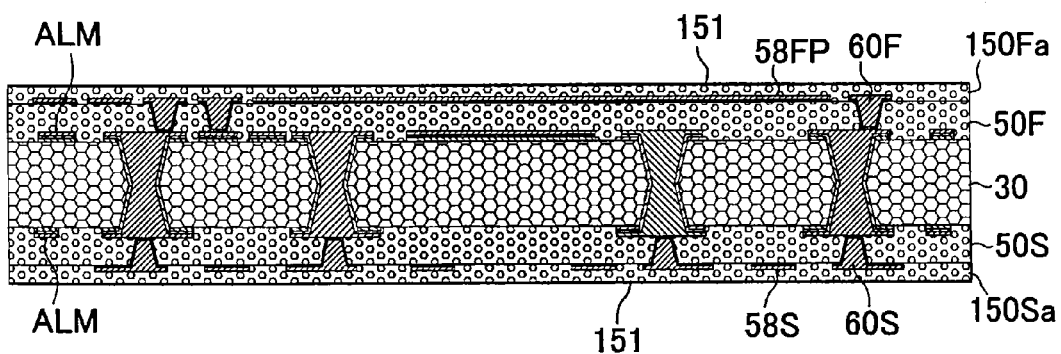

The package substrate of the present embodiment does not have via conductors that penetrate through only the inner-layer interlayer resin insulating layer. Therefore, the seed layer can be formed on the resin film before the lamination. Since the seed layer is formed by sputtering before the lamination, the seed layer has a thin and uniform thickness. However, it is also possible that the seed layer is formed on the inner-layer interlayer resin insulating layer after the inner-layer interlayer resin insulating layer is formed. The package substrate of the present embodiment does not have via conductors that penetrate through only the inner-layer interlayer resin insulating layer. Therefore, even when the seed layer is formed after the lamination, there is no need to form the seed layer on the inner walls of the openings for the via conductors. Therefore, the seed layer has a thin and uniform thickness. Similarly, An inner-layer interlayer resin insulating layer (lower side inner-layer interlayer resin insulating layer) (150Sa) is formed on the lower side second conductor layer (58S) and on the lower side interlayer resin insulating layer (50S) (FIG. 5B). In the present embodiment, the lower side inner-layer interlayer resin insulating layer is an interlayer resin insulating layer with a seed layer. The inner-layer interlayer resin insulating layers (150Fa, 150Sa) each have a thickness of 17 μm, which is about ½ of that of the interlayer resin insulating layers (50F, 50S).

Figure 5C:
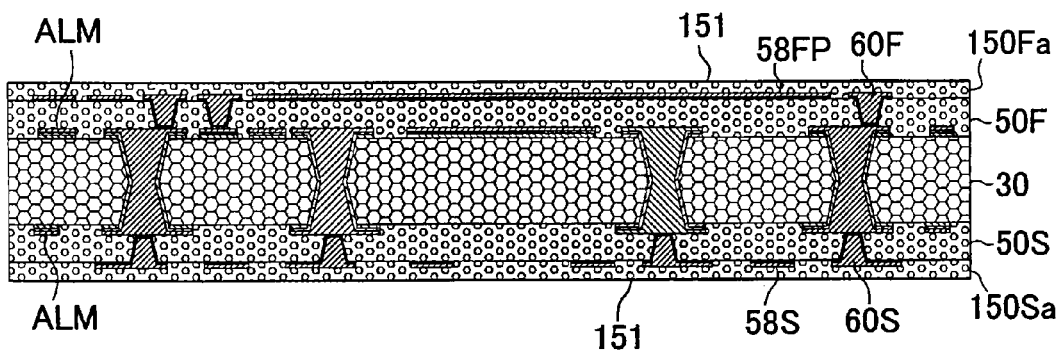
Figure 6A:
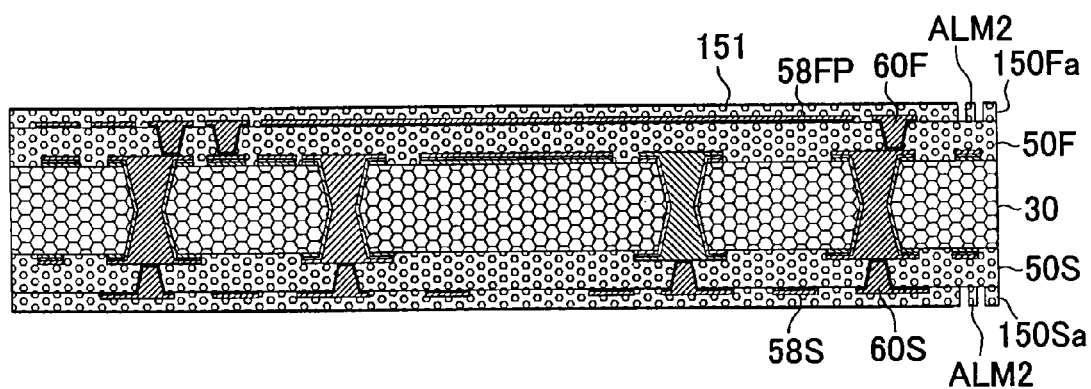
FIGS. 6A and 6B illustrate process diagrams illustrating the method for manufacturing the package substrate of the first embodiment.
Figure 6B:
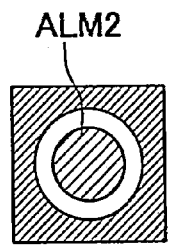

(10) A portion of the seed layer that is formed on the inner-layer interlayer resin insulating layer is removed. As a result, the seed layer on an alignment mark (ALM) that is formed in the second conductor layer is removed (FIG. 5C). In this case, the seed layer in an area where an alignment mark (ALM2) (to be described later) is formed is also removed. The alignment mark (ALM2) is formed in the inner-layer interlayer resin insulating layer with the alignment mark formed in the second conductor layer as a reference (FIG. 6A). An example of the alignment mark (ALM2) is depicted in FIG. 6B. Shaded portions are portions of the upper surface of the inner-layer interlayer resin insulating layer. A non-shaded portion is a groove. The alignment mark is formed by the inner-layer interlayer resin insulating layer and the groove that is formed in the inner-layer interlayer resin insulating layer. For example, the alignment mark is a ring-shaped groove that is formed in the inner-layer interlayer resin insulating layer, and is formed using laser.

Figure 7A:
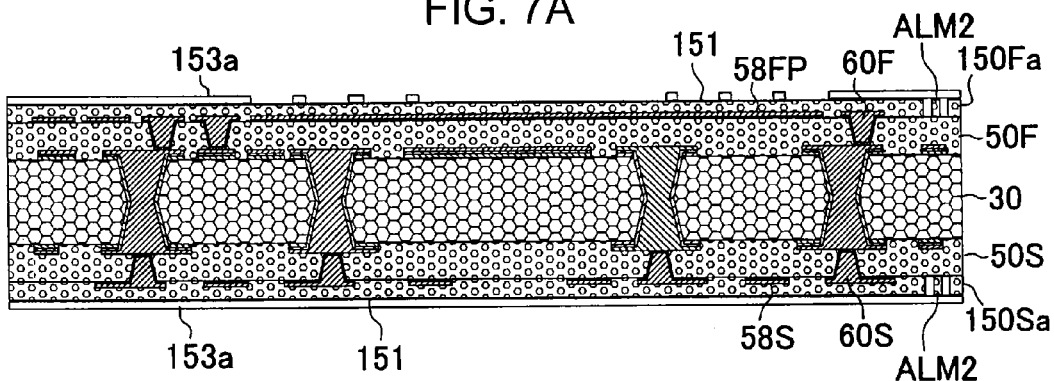
FIG. 7A-7C illustrate process diagrams illustrating the method for manufacturing the package substrate of the first embodiment.

(11) A plating resist (153a) is formed on the seed layer 151 with the alignment mark (ALM2) as a reference (FIG. 7A). The plating resist (153a) on the lower side inner-layer interlayer resin insulating layer is formed on the entire surface thereof.

Figure 7B:
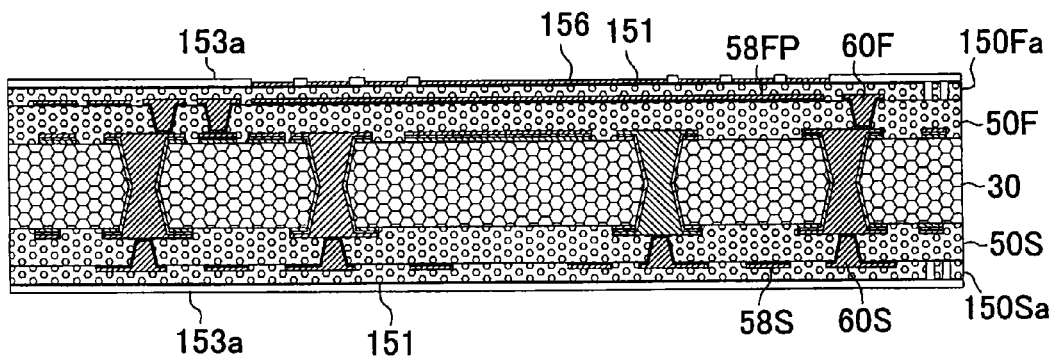

(12) An electrolytic copper plating layer 156 is formed on the seed layer 151 that is exposed from the plating resist (153a) (FIG. 7B).

Figure 7C:
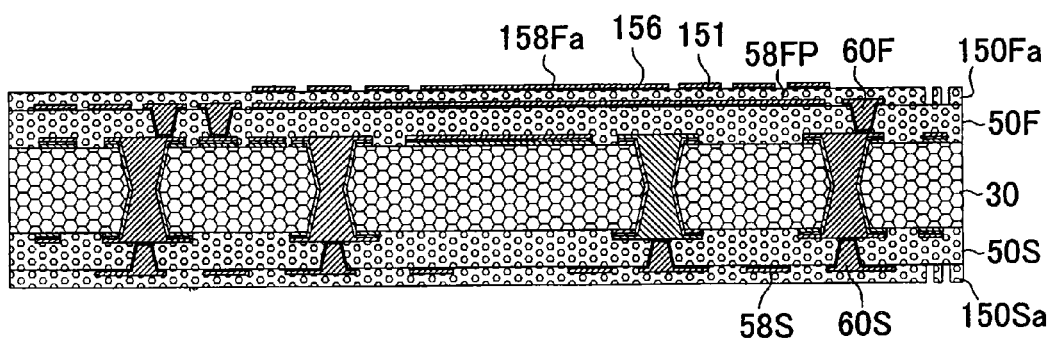
Figure 8A:
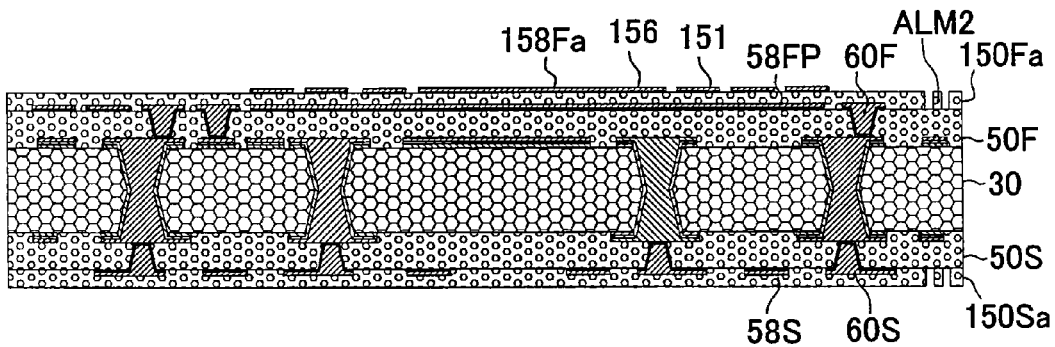
FIG. 8A-8C illustrate process diagrams illustrating the method for manufacturing the package substrate of the first embodiment.

(13) The plating resist (153a) is removed (FIG. 7C). The seed layer 151 that is exposed from the electrolytic copper plating layer 156 is removed. The first conductor layer (upper side first conductor layer) (158Fa) that includes the seed layer 151 and the electrolytic copper plating layer 156 on the seed layer is formed on the upper side inner-layer interlayer resin insulating layer (150Fa) (FIG. 8A). A portion of the first conductor layer (158Fa) is illustrated in FIGS. 11A and 11B. FIGS. 11A and 11B are plan views. L/S (line/space) of the first conductor circuits contained in the first conductor layer is, for example, 5/5 μm. The first via conductor pads (158Fai) and the second via conductor pads (158Fam) are also formed at the same time. The first conductor layer includes the via conductor pads and a first alignment mark that is formed at the same time. The first alignment mark is not illustrated in the drawings. When the resin film for forming the lower side inner-layer interlayer resin insulating layer is a resin film with a seed layer, the seed layer is removed. Since the seed layer is completely removed, it is preferable that the inner-layer interlayer resin insulating layer in the second build-up layer be formed from a resin film that does not have a seed layer. A conductor layer is not formed on the lower side inner-layer interlayer resin insulating layer.

Figure 8B:
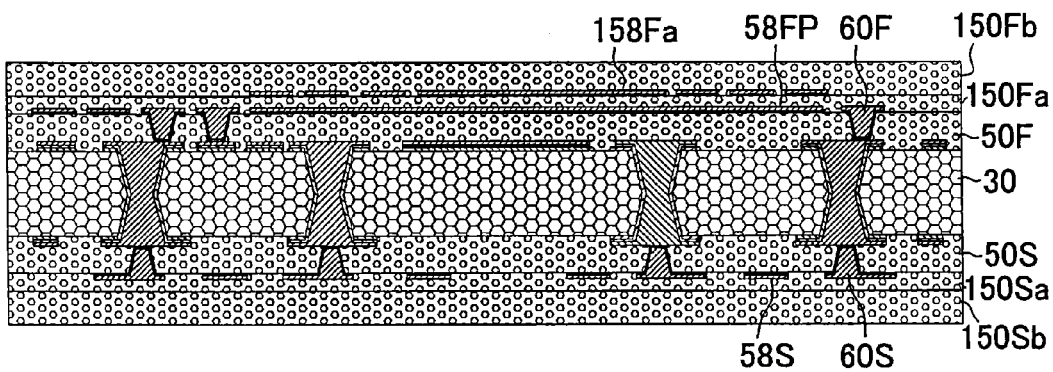

(14) The outermost interlayer resin insulating layer (upper side outermost interlayer resin insulating layer) (150Fb) is formed on the upper side inner-layer interlayer resin insulating layer and on the upper side first conductor layer (dedicated wiring layer). An outermost interlayer resin insulating layer (lower side outermost interlayer resin insulating layer) (150Sb) is formed on the lower side inner-layer interlayer resin insulating layer (FIG. 8B). The interlayer resin insulating layers (150Fb, 150Sb) have a thickness the same as that of the interlayer resin insulating layers (50F, 50S).

Figure 8C:
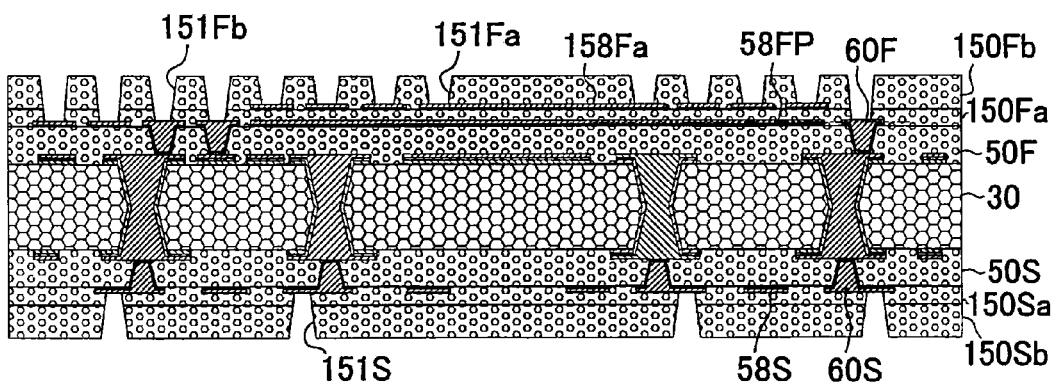

(15) First openings (151Fa) that penetrate through the upper side outermost interlayer resin insulating layer (150Fb) and reach the first conductor layer (158Fa) and the second openings (151Fb) that penetrate through the upper side outermost interlayer resin insulating layer (150Fb) and the upper side inner-layer interlayer resin insulating layer (150Fa) and reach the upper side second conductor layer (58FP) are formed using laser with the first alignment mark as a reference. Openings (151S) that penetrate through the lower side outermost interlayer resin insulating layer (150Sb) and the lower side inner-layer interlayer resin insulating layer (150Sa) and reach the lower side second conductor layer (58S) are formed (FIG. 8C).

Figure 9A:
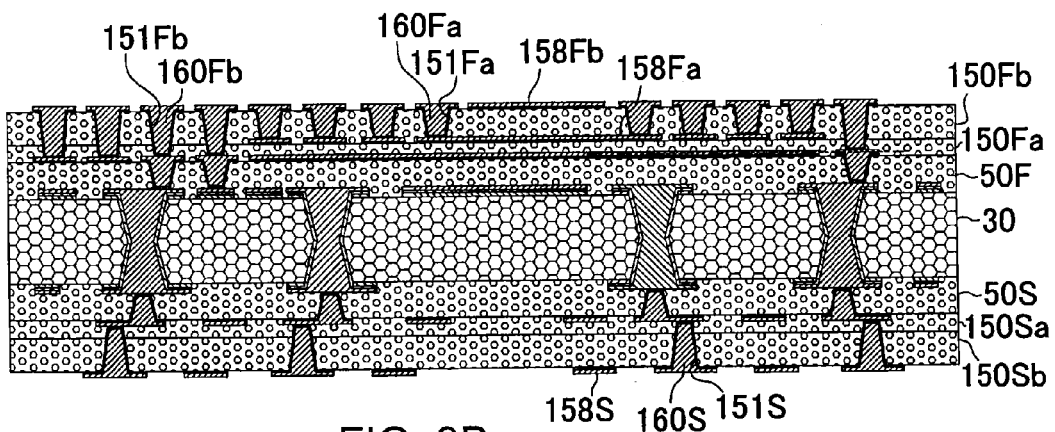
FIG. 9A-9C illustrate process diagrams illustrating the method for manufacturing the package substrate of the first embodiment.

(16) The via conductors (160Fa, 160Fb, 160S) are formed in the openings (151Fa, 151Fb, 151S) for the formation of the via conductors using a semi-additive method. Further, the outermost conductor layers (158Fb, 158S) are formed (FIG. 9A). The via conductors (160Fb, 160S) are skip via conductors, penetrate through both the outermost interlayer resin insulating layer and the inner-layer interlayer resin insulating layer and connect the outermost conductor layer and the second conductor layer. The outermost conductor layer and the second conductor layer have plane layers that sandwich the first conductor circuit. The outermost conductor layer and the first conductor layer are connected by the via conductors (160Fa). The upper side outermost conductor layer includes the first pad group and the second pad group. The second pad group has a first sub-group, a second sub-group, a third sub-group and a fourth sub-group. As illustrated in FIGS. 10A and 10B, the second pad group surrounds the first pad group. Each sub-group of the second pad group is formed on outside of each side of the first pad group.

Figure 9B:
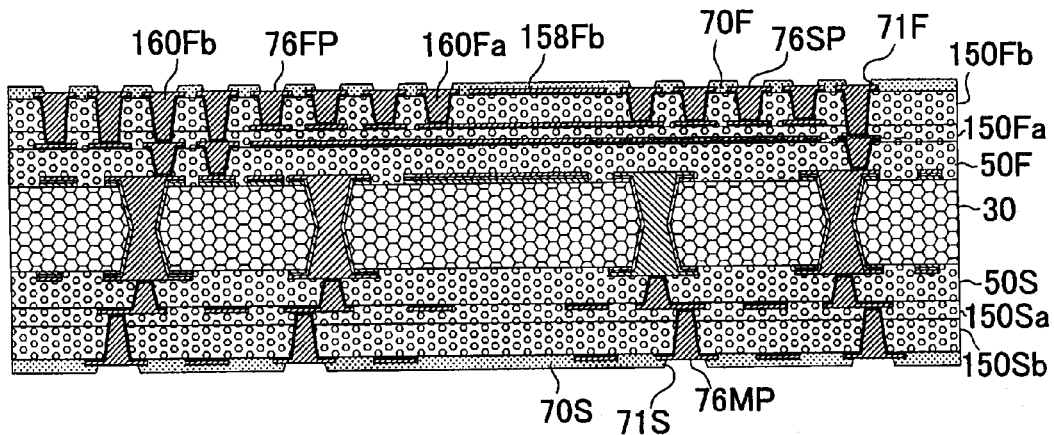

(17) The upper side solder resist layer (70F) having the openings (71F) is formed on the first build-up layer. The lower side solder resist layer (70S) having openings (71S) is formed on the second build-up layer (FIG. 9B). Upper surfaces of the first pads (76FP) and the second pads (76SP) are exposed from the openings (71F) of the first solder resist layer (70F). On the other hand, upper surfaces of the conductor layer and via lands that exposed from the openings (71S) of the second solder resist layer (70S) function as the pads (76MP) for connecting to the motherboard.

Figure 9C:
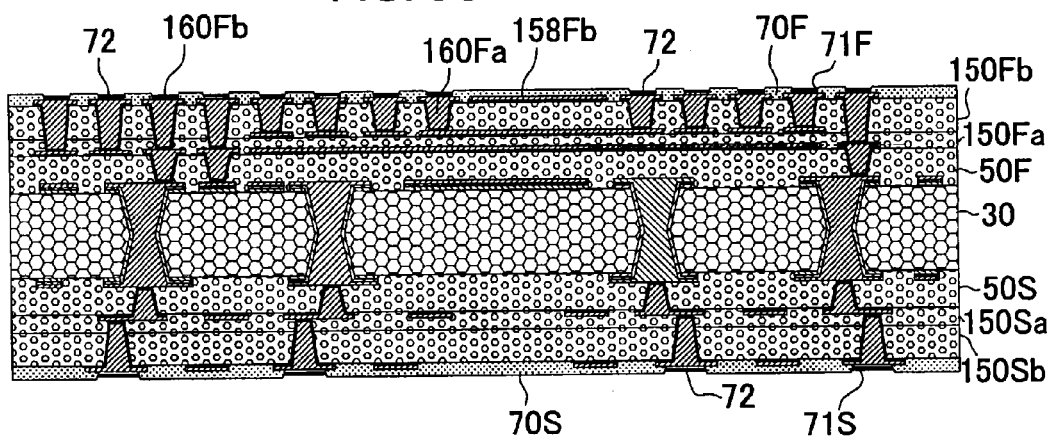

(18) A nickel plating layer is formed on each of the pads (76FP, 76SP, 76MP), and a gold plating layer is further formed on the nickel plating layer. Thereby, the metal layer 72 including the nickel plating layer and the gold plating layer is formed (FIG. 9C). It is also possible that, instead of the nickel-gold layer, a nickel-palladium-gold layer or an OSP film is formed.

(19) Solder balls are mounted on the pads (76FP, 76SP, 76MP), and the solder bumps (76FM, 76FL, 76S) are formed by reflow. The package substrate 10 is completed (FIG. 1).

(20) The logic IC chip (110L) is mounted on the solder bumps (76FL) of the first pads. The memory (110M) is mounted on the solder bumps (76FM) of the second pads (FIGS. 2 and 10B). Spaces between the package substrate and the IC chip (110L) and the memory (110M) are filled with an underfill 114 (FIG. 2).

In the method for manufacturing the package substrate of the first embodiment, the first conductor layer (158Fa) is formed using the seed layer of the resin film with the seed layer. The seed layer is formed on a single film. Therefore, a thickness of the seed layer and variation of the thickness of the seed layer can be reduced. Further, the seed layer can be formed by sputtering. The first conductor layer is a dedicated wiring layer for transmitting data. Therefore, the thickness of the first conductor layer can be reduced. Since the seed layer has a small thickness, when the conductor circuits are formed, the seed layer is removed with a small etching amount. Therefore, fine conductor circuits can be formed in the first conductor layer. For example, the first conductor layer has fine signal lines of which L/S is (8 µm)/(8 µm) or less. In the first embodiment, there is no conductor layer on the lower side inner-layer interlayer resin insulating layer. Therefore, it is also possible that the lower side inner-layer interlayer resin insulating layer is not included. In this case, in order to reduce warpage of the package substrate, it is preferable that one interlayer resin insulating layer included in the second build-up layer have a thickness greater than that of other interlayer resin insulating layer. The thickness of the one interlayer resin insulating layer is a thickness obtained by adding the thickness of the upper side inner-layer interlayer resin insulating layer and the thicknesses of the interlayer resin insulating layers other than the upper side inner-layer interlayer resin insulating layer.

Second Embodiment

Figure 12:
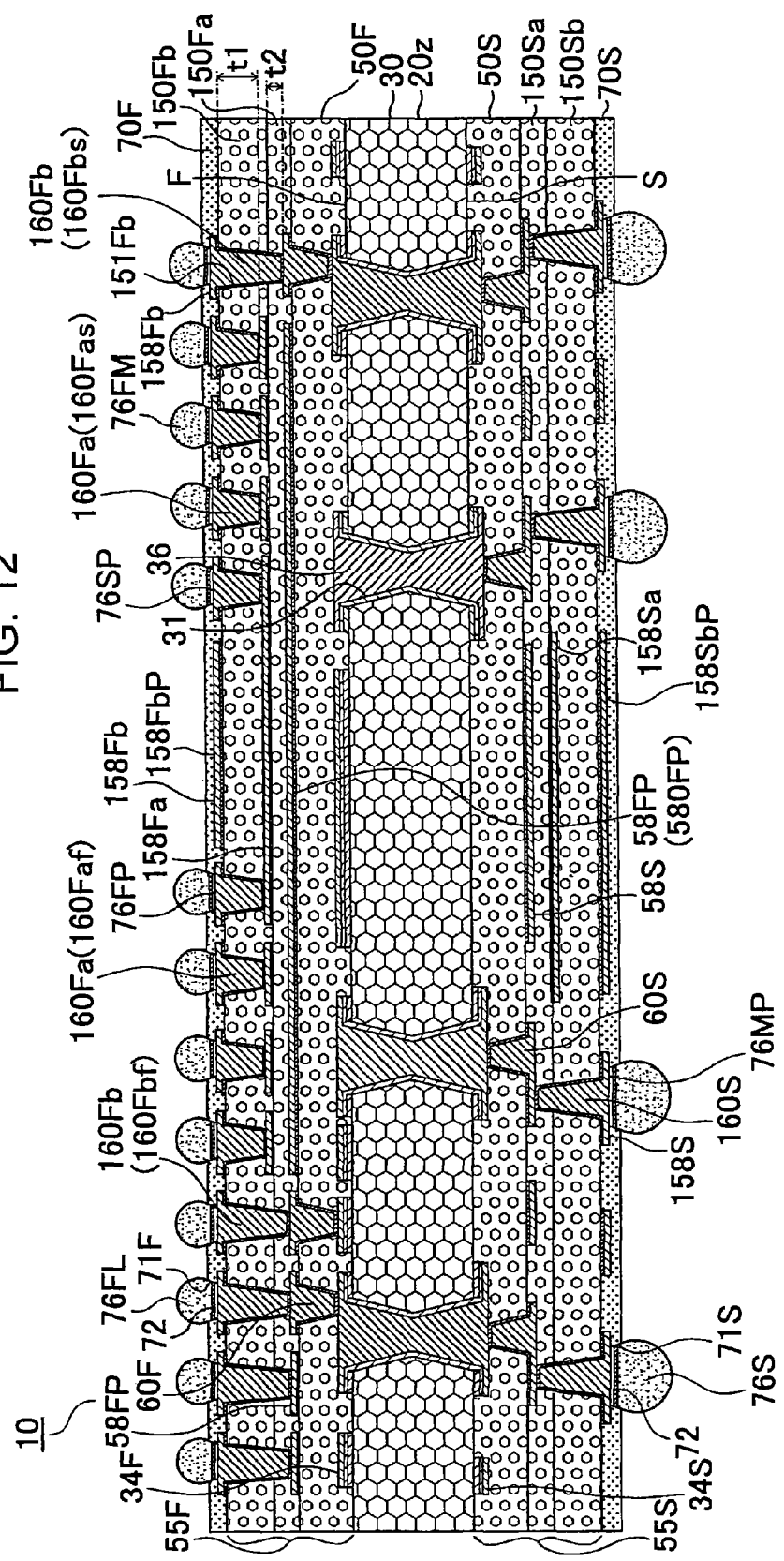
FIG. 12 illustrates cross-sectional view of a package substrate according to a second embodiment.

FIG. 12 illustrates a package substrate according to a second embodiment. The second embodiment has multiple dedicated wiring layer.

In the second embodiment, a second dedicated wiring layer (158Sa) is formed on the lower side inner-layer interlayer resin insulating layer (150Sa). In this way, according to the present embodiment, the dedicated wiring layers can be formed in different layers. In the second embodiment, the second dedicated wiring layer is formed in the second build-up layer. However, it is also possible that the second dedicated wiring layer is formed in the first build-up layer. The first build-up layer is close to the electronic component. Therefore, it is preferable that the second dedicated wiring layer be formed in the first build-up layer. In the package substrate of the second embodiment, it is desirable that areas where the first dedicated wiring layer (158Fa) and the second dedicated wiring layer (158Sa) are in contact with the inner-layer interlayer resin insulating layers be 3%-15% of areas (150Fa, 150Sa) of upper surfaces of the inner-layer interlayer resin insulating layers. As a result, an effect due to warpage is reduced and high connection reliability is obtained.

Third Embodiment

Figure 13:
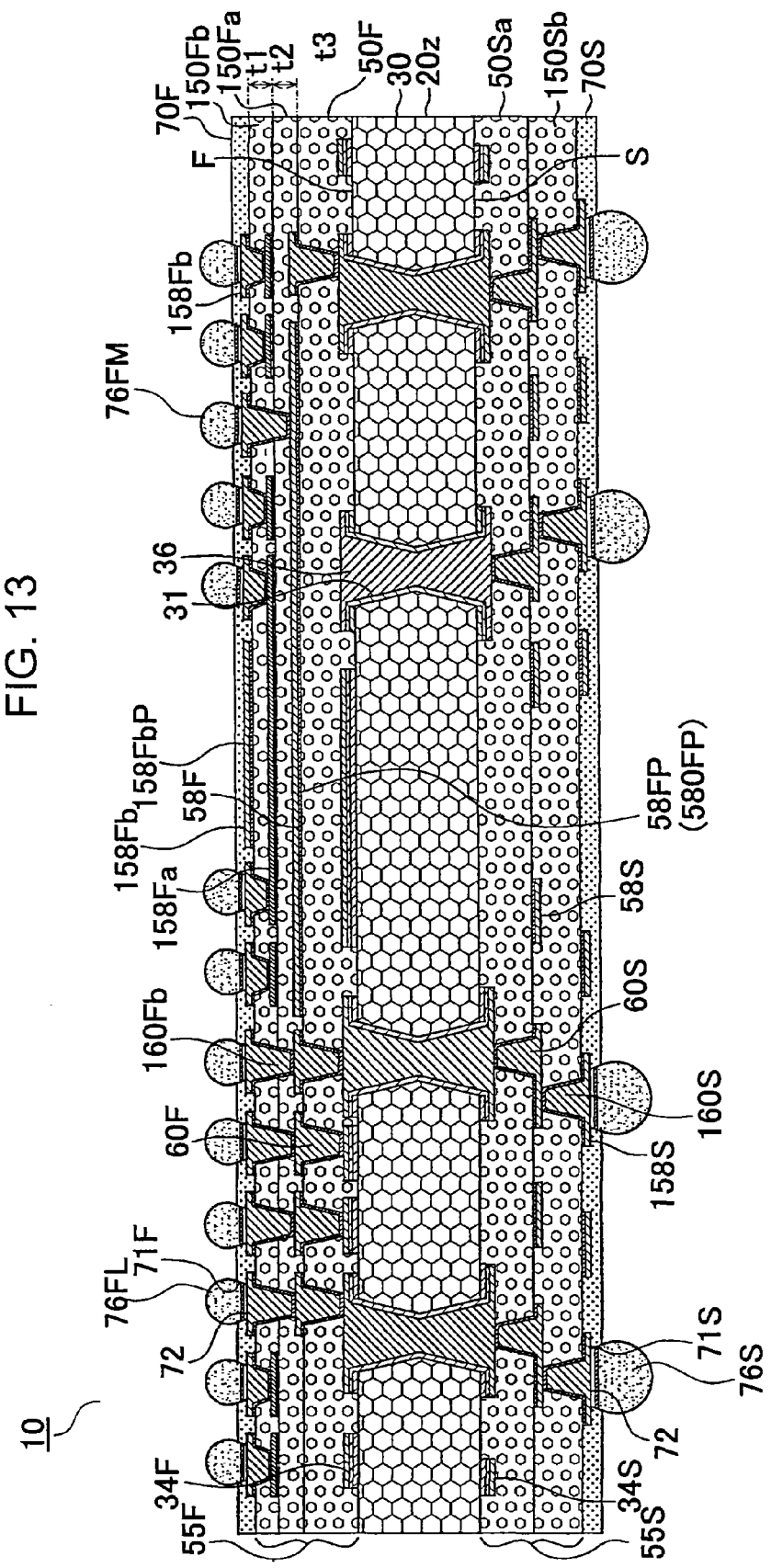
FIG. 13 illustrates cross-sectional view of a package substrate according to a third embodiment.

A package substrate of a third embodiment is illustrated in FIG. 13. In the third embodiment, the second build-up layer (55S) does not have an inner-layer interlayer resin insulating layer. The outermost interlayer resin insulating layer (150Sb) of the second build-up layer (55S) is formed at the same time when the outermost interlayer resin insulating layer (150Fa) of the first build-up layer (55F) is formed. A thickness of the interlayer resin insulating layer (150Sb) is a thickness that is obtained by adding the thickness (t2) of the interlayer resin insulating layer (150Fa) and the thickness (t1) of the interlayer resin insulating layer (150Fb). In the package substrate of the third embodiment, an area where the first conductor layer (158Fa) is in contact with the inner-layer interlayer resin insulating layer is 3%-15% of the area of the upper surface of the inner-layer interlayer resin insulating layer (150Fa). As a result, an effect due to warpage is reduced and high connection reliability is obtained.

When a wiring layer has both the wiring connecting the two LSIs and the power-source wiring or the ground wiring, it may be difficult to increase a transmission speed between electronic components.

A package substrate according to an embodiment of the present invention increases a signal transmission speed between electronic components and is unlikely to have warpage, and another embodiment of the present invention is a method for manufacturing such a package substrate.

A package substrate according to an embodiment of the present invention includes: an outermost interlayer resin insulating layer that has a first surface and a second surface that is on an opposite side of the first surface; an outermost conductor layer that is formed on the first surface of the outermost interlayer resin insulating layer and includes a first pad group in which first pads for mounting a first electronic component are formed and a second pad group in which second pads for mounting a second electronic component are formed; a first conductor layer that is formed below the second surface of the outermost interlayer resin insulating layer and includes first conductor circuits; an inner-layer interlayer resin insulating layer that is formed below the second surface of the outermost interlayer resin insulating layer and the first conductor layer; a second conductor layer that is formed below the inner-layer interlayer resin insulating layer; first via conductors that penetrate through the outermost interlayer resin insulating layer and connect the first conductor layer and the first pads; second via conductors that penetrate through the outermost interlayer resin insulating layer and connect the first conductor layer and the second pads; and skip via conductors that penetrate through both the outermost interlayer resin insulating layer and the inner-layer interlayer resin insulating layer and connect the outermost conductor layer and the second conductor layer. An area of the first conductor layer is 3%-15% of an area of an upper surface of the inner-layer interlayer resin insulating layer.

A method for manufacturing a package substrate according to an embodiment of the present invention includes: preparing a resin film with a seed layer; curing the resin film to form an inner-layer interlayer resin insulating layer that has a first surface and a second surface that is on an opposite side of the first surface and has the seed layer that is formed on the first surface; using the seed layer and a semi-additive method to form a dedicated wiring layer for data transmission between electronic components on the first surface of the inner-layer interlayer resin insulating layer; forming an outermost interlayer resin insulating layer on the dedicated wiring layer and on the first surface of the inner-layer interlayer resin insulating layer; forming a second conductor layer below the second surface of the inner-layer interlayer resin insulating layer; forming an outermost conductor layer that includes first pads for mounting a first electronic component and second pads for mounting a second electronic component on the outermost interlayer resin insulating layer; forming first via conductors that penetrate through the outermost interlayer resin insulating layer and connect the first pads and the dedicated wiring layer; forming second via conductors that penetrate through the outermost interlayer resin insulating layer and connect the second pads and the dedicated wiring layer; and forming skip via conductors that penetrate through both the outermost interlayer resin insulating layer and the inner-layer interlayer resin insulating layer and connect the outermost conductor layer and the second conductor layer. An area of the dedicated wiring layer is 3%-15% of an area of an upper surface of the inner-layer interlayer resin insulating layer.

Obviously, numerous modifications and variations of the present invention are possible in light of the above teachings. It is therefore to be understood that within the scope of the appended claims, the invention may be practiced otherwise than as specifically described herein.

What is claimed is:

1. A package substrate, comprising:
   a plurality of interlayer resin insulating layers comprising an outermost interlayer resin insulating layer and an inner-layer interlayer resin insulating layer;
   a plurality of conductor layers comprising an outermost conductor layer formed on the outermost interlayer resin insulating layer, a first conductor layer formed between the outermost interlayer resin insulating layer and the inner-layer interlayer resin insulating layer, and a second conductor layer on which the inner-layer interlayer resin insulating layer is formed;
   a plurality of via conductors comprising a plurality of first via conductors formed through the outermost interlayer resin insulating layer and a plurality of second via conductors formed through the outermost interlayer resin insulating layer; and
   a plurality of skip via conductors formed through the outermost interlayer resin insulating layer and the inner-layer interlayer resin insulating layer such that the skip via conductors are connecting the outermost conductor layer and the second conductor layer,
   wherein the outermost conductor layer includes a plurality of first pads positioned to mount a first electronic component on the outermost interlayer resin insulating layer and a plurality of second pads positioned to mount a second electronic component on the outermost interlayer resin insulating layer, the plurality of first via conductors is positioned such that the first via conductors are connecting the first conductor layer and the first pads, the plurality of second via conductors is positioned such that the second via conductors are connecting the first conductor layer and the second pads, and the first conductor layer is formed such that the first conductor layer has an area on a surface of the inner-layer interlayer resin insulating layer which is in a range of 3% to 15% of an area of the surface of the inner-layer interlayer resin insulating layer.

2. A package substrate according to claim 1, wherein the first conductor layer includes a plurality of first conductor circuits formed such that each of the first conductor circuits is connecting one of the first pads and one of the second pads.

3. A package substrate according to claim 1, wherein the first conductor layer is consisting of a plurality of first conductor circuits formed such that the plurality of first conductor circuits is configured to transmit data between the first electronic component and the second electronic component.

4. A package substrate according to claim 1, wherein the inner-layer interlayer resin insulating layer does not have a via conductor penetrating through only the inner-layer interlayer resin insulating layer.

5. A package substrate according to claim 1, wherein the outermost interlayer resin insulating layer and the inner-layer interlayer resin insulating layer have thickness which are substantially equal.

6. A package substrate according to claim 1, wherein the outermost interlayer resin insulating layer has a thickness which is twice or greater than a thickness of the inner-layer interlayer resin insulating layer.

7. A package substrate according to claim 1, wherein the first conductor layer comprises a plurality of first conductive circuits formed such that each of the first conductive circuits has a width which is in a range of ½ to ⅓ of a width of conductor circuits of the outermost conductor layer and the second conductor layer and a thickness which is a half or less than thicknesses of the conductor circuits of the outermost conductor layer.

8. A package substrate according to claim 1, wherein the outermost conductor layer, the first conductor layer and the second conductor layer form a strip line structure.

9. A package substrate according to claim 1, wherein the first electronic component is a logic IC device, and the second electronic component is a memory device.

10. A package substrate according to claim 1, wherein the first conductor layer comprises a plurality of first conductive circuits formed such that each of the first conductive circuits has a width which is in a range of ½ to ⅓ of a width of conductor circuits of the outermost conductor layer and the second conductor layer.

11. A package substrate according to claim 1, wherein the first conductor layer comprises a plurality of first conductive circuits formed such that each of the first conductive circuits has a thickness which is a half or less than thicknesses of the conductor circuits of the outermost conductor layer.

12. A package substrate according to claim 1, wherein the first conductor layer comprises a plurality of first conductive circuits formed such that each of the first conductive circuits has a width which is in a range of ½ to ⅓ of a width of conductor circuits of the outermost conductor layer and the second conductor layer.

13. A package substrate according to claim 1, wherein the first conductor layer comprises a plurality of first conductive circuits formed such that each of the first conductive circuits has a thickness which is a half or less than thicknesses of the conductor circuits of the outermost conductor layer.

14. A package substrate according to claim 1, wherein the plurality of skip via conductors comprises a plurality of first skip via conductors and a plurality of second skip via conductors such that the plurality of first skip via conductors is positioned to connect the first electronic component and the second conductor layer and that the plurality of second skip via conductors is positioned to connect the second electronic component and the second conductor layer.

15. A package substrate according to claim 1, further comprising:
   a second outermost interlayer resin insulating layer formed on an opposite side with respect to the outermost interlayer resin insulating layer; and
   a second outermost conductor layer formed on the second outermost interlayer resin insulating layer such that the second outermost conductor layer includes a plurality of pads positioned to mount a mother board on the second outermost interlayer resin insulating layer.

16. A method for manufacturing a package substrate, comprising:
   forming an inner-layer interlayer resin insulating layer;
   forming a first conductor layer on a surface of the inner-layer interlayer resin insulating layer such that the first conductor layer is configured to transmit data between a first electronic component and a second electronic component;
   forming an outermost interlayer resin insulating layer on the inner-layer interlayer resin insulating layer such that the outermost interlayer resin insulating layer covers the first conductor layer;
   forming an outermost conductor layer comprising a plurality of first pads and a plurality of second pads such that the plurality of first pads is positioned to mount the first electronic component on the outermost interlayer resin insulating layer and that the plurality of second pads is positioned to mount the second electronic component on the outermost interlayer resin insulating layer;
   forming a plurality of first via conductors through the outermost interlayer resin insulating layer such that the plurality of first via conductors connects the first pads and the first conductor layer;
   forming a plurality of second via conductors through the outermost interlayer resin insulating layer such that the plurality of second via conductors connects the second pads and the first conductor layer; and
   forming a plurality of skip via conductors through the outermost interlayer resin insulating layer and the inner-layer interlayer resin insulating layer such that the plurality of skip via conductors connects the outermost conductor layer and a second conductor layer on which the inner-layer interlayer resin insulating layer is formed,
   wherein the first conductor layer is formed such that the first conductor layer has an area on the surface of the inner-layer interlayer resin insulating layer which is in a range of 3% to 15% of an area of the surface of the inner-layer interlayer resin insulating layer.

17. A method for manufacturing a package substrate according to claim 16, wherein the forming of the inner-layer interlayer resin insulating layer comprises curing a resin film having a seed layer such that the inner-layer interlayer resin insulating layer having the seed layer on the surface of the inner-layer interlayer resin insulating layer is formed, and the forming of the first conductor layer comprises forming the first conductor layer comprising the seed layer by a semi-additive process.

18. A method for manufacturing a package substrate according to claim 16, wherein the forming of the first conductor layer comprises forming the first conductor layer comprising a plurality of first conductor circuits formed such that each of the first conductor circuits is connecting one of the first pads and one of the second pads.

19. A method for manufacturing a package substrate according to claim 16, wherein the forming of the first conductor layer comprises forming the first conductor layer consisting of a plurality of first conductor circuits formed such that the plurality of first conductor circuits is configured to transmit data between the first electronic component and the second electronic component.

20. A method for manufacturing a package substrate according to claim 16, wherein the outermost conductor layer, the first conductor layer and the second conductor layer are formed such that the outermost conductor layer, the first conductor layer and the second conductor layer form a strip line structure.

* * * * *